(12) United States Patent
Cadilhon et al.

(10) Patent No.: US 10,097,085 B2
(45) Date of Patent: Oct. 9, 2018

(54) SYSTEM AND METHOD FOR GENERATING HIGH PULSED POWER, COMPRISING A SINGLE POWER SUPPLY

(71) Applicant: COMMISSARIAT A L'ENERGIE ATOMIQUE ET AUX ENERGIES ALTERNATIVES, Paris (FR)

(72) Inventors: Baptiste Cadilhon, La Teste de Buch (FR); Bruno Cassany, Hostens (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 49 days.

(21) Appl. No.: 15/302,710

(22) PCT Filed: Apr. 7, 2015

(86) PCT No.: PCT/EP2015/057439
§ 371 (c)(1),
(2) Date: Oct. 7, 2016

(87) PCT Pub. No.: WO2015/155148
PCT Pub. Date: Oct. 15, 2015

(65) Prior Publication Data
US 2017/0033686 A1 Feb. 2, 2017

(30) Foreign Application Priority Data

Apr. 8, 2014 (FR) ...................................... 14 53100

(51) Int. Cl.
*G05F 1/10* (2006.01)
*H02M 3/07* (2006.01)
(Continued)

(52) U.S. Cl.
CPC ................ *H02M 3/07* (2013.01); *H03K 3/53* (2013.01); *H03K 3/57* (2013.01); *H03K 17/691* (2013.01)

(58) Field of Classification Search
CPC .......... H03K 3/53; H03K 3/57; H03K 17/691; H02M 3/07
(Continued)

(56) References Cited

U.S. PATENT DOCUMENTS 3,845,322 A * 10/1974 Aslin ..................... H03K 3/537
307/108
5,105,097 A * 4/1992 Rothe .................... H03K 17/80
307/108
(Continued)

FOREIGN PATENT DOCUMENTS

GB          758069          9/1956

OTHER PUBLICATIONS

International Search Report dated Aug. 27, 2015 in PCT/EP2015/057439 filed Apr. 7, 2015.
(Continued)

*Primary Examiner* — Thomas Skibinski
(74) *Attorney, Agent, or Firm* — Oblon, McClelland, Maier & Neustadt, L.L.P.

(57) ABSTRACT

A system for generating pulsed power, including: an input receiving an input pulse; a pulse generator generating high voltage pulses including a first input receiving a signal from the input pulse in a charge phase of the generator and a second input receiving a trigger signal of a discharge phase of the generator; a control circuit connected to both the input for receiving the input pulse and to the second input of the generator, the control circuit configured to generate a trigger signal when the end of the input pulse is detected.

10 Claims, 3 Drawing Sheets

(51) Int. Cl.
  *H03K 3/53*   (2006.01)
  *H03K 3/57*   (2006.01)
  *H03K 17/691* (2006.01)

(58) Field of Classification Search
  USPC .................................. 307/108; 327/535–537
  See application file for complete search history.

(56) References Cited

U.S. PATENT DOCUMENTS

| | | |
|---|---|---|
| 5,311,067 A | 5/1994 | Grothaus et al. |
| 2002/0105773 A1 | 8/2002 | Seely et al. |
| 2007/0216230 A1* | 9/2007 | Hofmann ............... H03K 3/537 307/108 |
| 2009/0184585 A1 | 7/2009 | Hartmann |

OTHER PUBLICATIONS

French Search Report dated Dec. 19, 2014 in FR 1453100 filed Apr. 8, 2014.

* cited by examiner

SYSTEM AND METHOD FOR GENERATING HIGH PULSED POWER, COMPRISING A SINGLE POWER SUPPLY

TECHNICAL FIELD

The field of the invention is that of the generation of high pulsed power according to the principle of slow storage of a certain quantity of energy and the rapid restitution thereof.

STATE OF THE PRIOR ART

High pulsed power finds application in different fields. A first application field is that of pulsed power supplies for lasers, X-ray diodes, magnetrons, electron beams or UV flashes. A second field of application relates to the generation of electromagnetic waves which find their utility in radars or electronic jammers. Another field of application is that of simulators, such as simulators of lightning waves, electromagnetic compatibility or electromagnetic launchers. And a fourth field concerns pollution removal of gases, solids or liquids by pulsed electric field methods, by corona effects or by shock waves, as well as surface treatments.

Generally speaking, a high voltage pulse generator includes a storage capacitor charged through a resistor by a power supply source. Once the energy has been stored, it is rapidly returned to use through a switch triggered for this purpose.

When the amplitudes of the voltages required at output are higher than those delivered by the power supply, voltage boosting devices, such as for example a Marx generator, may be used. The principle of a Marx generator consists in charging to an initial voltage $V0$ n capacitors associated in parallel, then discharging them after having associated them in series by means of switches, so as to apply the voltage $n*V0$ on use.

Two voltage signals are required for the operation of such a high voltage pulse generator: one relative to the supply with electrical energy of the generator to achieve the charge of the capacitor(s), the other corresponding to a control signal making it possible to trigger the switch(es) to achieve the discharge and to generate the pulse.

As an example of commercially available generator, the generator PT-55 of the firm Pacific Atlantic Electronics may be cited. This generator is associated with an ancillary module PT-70 which supplies a continuous high voltage signal (7 kV) through a HV cable and a control signal (250V) through a coaxial cable. It moreover comprises a radioactive source of Nickel 63 (encapsulated in a vacuum bulb) to achieve the switching of the electrical energy.

The generator 40168 of the firm L3 Communications which uses a thyratron (mercury vapour tube) to produce a high voltage pulse of 50 kV may also be cited. This generator requires a supply of pressurised air to ensure its operating stability, a mains supply cable and a coaxial cable for the control of the triggering of the thyratron. This generator has the drawback of great EMC sensitivity, which considerably alters its operation in perturbed environment. The firm L3 Communications also proposes the generator TG-75 which operates at 50 kV from the 220V/50 Hz network for its supply and a control signal supplied by an optic fibre.

DESCRIPTION OF THE INVENTION

The objective of the invention is a high voltage pulse generator that does not have the aforementioned drawbacks, in particular a generator that is simpler to implement in that it may be managed by a single and unique cable. To do so it proposes a system for generating pulsed power, including an input for receiving an input pulse and a high voltage pulse generator including a first input for receiving a signal from the input pulse in a charge phase of the generator and a second input for receiving a trigger signal of a discharge phase of the generator, characterised in that it comprises a control circuit which is connected to both the input for receiving the input pulse and to the second input of the generator, the control circuit being configured to detect the end of the input pulse and to generate a trigger signal when the end of the input pulse is detected.

Certain preferred but non-limiting aspects of this system are the following:
- the control circuit includes a differentiator circuit configured to detect a positive or negative part of the derivative of the input pulse, and a triggering circuit configured to supply said trigger signal following the detection, by the differentiator circuit, of a positive or negative part of the derivative of the input pulse;
- the triggering circuit includes a capacitor connected both to the first input of the generator and to the second input of the generator through a switch open in charge phase of the generator, the closing of said switch being controlled following the detection, by the differentiator circuit, of a positive or negative part of the derivative of the input pulse;
- the closing of said switch is achieved through a ferrite pulse transformer arranged between the differentiator circuit and the triggering circuit;
- it further includes a voltage boosting circuit arranged between the input for receiving the input pulse and the first input of the generator and configured to supply a continuous high voltage signal to the first input of the generator;
- the generator includes at least one switch capable of being triggered on receiving, by the second input of the generator, the trigger signal of a discharge phase of the generator;
- the generator includes a plurality of switches with synchronised triggering on receiving, by the second input of the generator, the trigger signal of a discharge phase of the generator;
- the generator comprises a ferrite pulse transformer including a ferrite core crossed by a wire in which transits the trigger signal of a discharge phase of the generator, a plurality of windings being positioned on the core, each of the windings being connected to one of the switches;
- the generator is a Marx generator including a plurality of capacitors connected together so as to be able to be charged in parallel, and to be discharged in series through switches;
- it further includes a low voltage signal source connected to the input for receiving the input signal through a coaxial cable.

The invention also relates to a method for generating high pulsed power by means of a high voltage pulse generator including a first input for receiving a signal from an input pulse in a charge phase of the generator and a second input for receiving a trigger signal of a discharge phase of the generator, characterised in that it comprises the steps consisting in detecting the end of the input pulse, and, following the detection of the end of the input pulse, generating and supplying to the second input of the generator a trigger signal of the discharge phase.

BRIEF DESCRIPTION OF THE DRAWINGS

Other aspects, aims, advantages and characteristics of the invention will become clearer on reading the following detailed description of preferred forms of embodiment thereof, given as non-limiting examples, and made in reference to the appended drawings in which.

DETAILED DESCRIPTION OF PARTICULAR EMBODIMENTS

Figure 1:
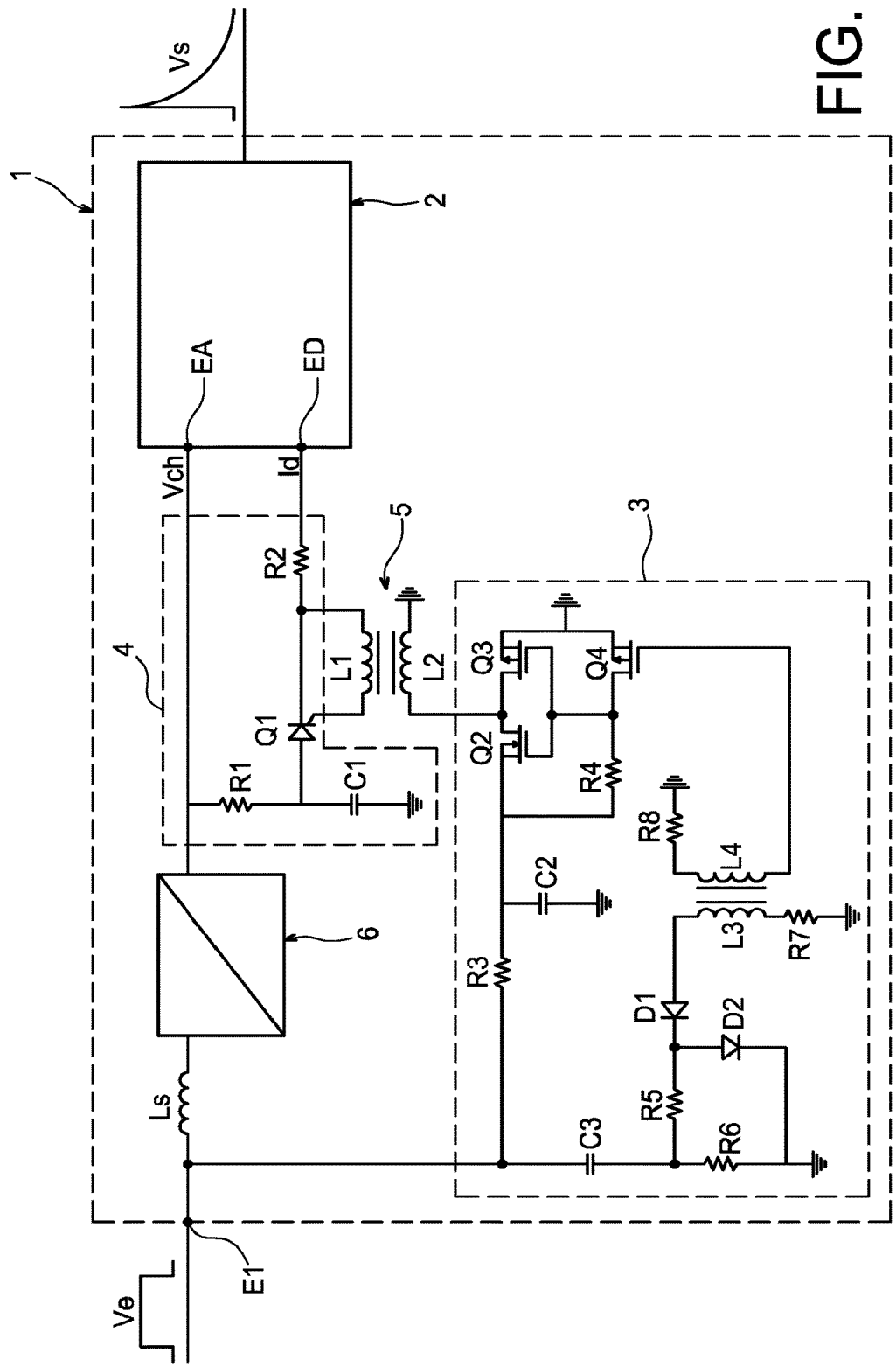
FIG. 1 represents a system for generating pulsed power according to a possible embodiment of the invention.

With reference to FIG. 1, the invention relates to a system for generating pulsed power 1, including an input EI for receiving an input pulse Ve and a pulse generator 2 generating high voltage pulses Vs including a first input EA for receiving a signal Vch coming directly or not from the input pulse Ve in a charge phase of the generator and a second input ED for receiving a trigger signal Id of a discharge phase of the generator.

The input pulse Ve is a low voltage signal typically taking the form of a rectangular pulse.

A high voltage pulse Vs at the output of the generator 2 has a voltage of amplitude above 1 kV, typically an amplitude of the order of several tens of kilovolts. This amplitude is adjustable: it depends on the duration and/or the amplitude of the low voltage input pulse, the number of stages which can compose the generator 2 and the charge voltage of each stage.

With reference to FIG. 1, the system 1 may comprise a voltage boosting circuit 6 arranged between the input EI for receiving the input pulse, for example in series with an inductance Ls present at the receiving input EI, and the first input EA of the generator 2. The voltage boosting circuit 6 may be configured to supply a continuous high voltage signal to the first input EA of the generator 2. It may be for example a 12V to 1500V DC/DC converter.

The system for generating pulsed power 1 according to the invention moreover includes a control circuit 3, 4, 5 which is connected to both the input EI for receiving the input pulse and to the second input ED of the generator, the control circuit being configured to detect the end of the input pulse Ve and to generate a trigger signal Id when the end of the input pulse Ve is detected.

Thus, the two voltage signals required for the operation of the generator 2, that is to say on charging the capacitor(s) and on triggering the switch(es), are from a same input signal, the input pulse Ve, and may thus be conveyed to the system according to the invention, for example from a low voltage signal source, through a single cable, notably by a single low voltage coaxial cable, for example a 50Ω coaxial cable.

The control circuit may in particular include a differentiator circuit 3 configured to detect a positive or negative part of the derivative of the input pulse, and a triggering circuit 4 configured to supply said trigger signal Id following the detection, by the differentiator circuit 3, of a positive or negative part of the derivative of the input pulse. Taking the example of a positive, respectively negative, rectangular pulse the differentiator circuit 3 makes it possible to detect a negative, respectively positive, part of the derivative of the pulse synonymous with the end of the pulse, that is to say the descending front, respectively the rising front, of the rectangular pulse.

As represented in FIG. 1, the triggering circuit 4 may include a capacitor C1 connected both to the first input EA of the generator, for example through a first resistor R1 and to the second input of the generator ED through a switch Q1 and a second resistor R2. The switch Q1 is controlled in such a way as to be open during the charge phase of the generator 2, thus enabling the charge of the capacitor C1 via the first resistor R1. The switch Q1 is moreover controlled to close following the detection, by the differentiator circuit 3, of the end of the input pulse, then enabling the discharge of the capacitor C1 and the generation of a current pulse Id serving as trigger signal of a discharge phase of the generator 2 delivered to the second input ED of the generator 2.

As also represented in FIG. 1, the differentiator circuit 3 may include a first branch for generating a signal for controlling the triggering circuit 3 and a second branch for treating the input pulse. The second branch makes it possible to derivate the input pulse and to supply a control signal to the first branch when the derivative is negative.

More precisely, the first branch includes a RC series circuit constituted of a third resistor R3 and a second capacitor C2, the input of which is connected to the input EI of the system 1 to enable the storage of energy in the second capacitor in the presence of a pulse Ve on the input EI. The output of the RC series circuit is connected to earth through two MOSFET transistors (second transistor Q2 and third transistor Q3) mounted in series and with opposite polarities, the second transistor Q2 being of P type and the third transistor Q3 being of N type ("push-pull" type mounting).

The mid-point between the transistors Q2, Q3 constitutes the output of the differentiator circuit 3, on which is found, when the end of the input pulse Ve is detected, a signal controlling the closing of the switch Q1 of the triggering circuit 4.

The gates of the transistors Q2, Q3 are moreover connected together and to a mid-point between a fourth resistor R4 connected to the output of the RC circuit and a fourth transistor Q4 of N type connected to earth and of which the gate is connected to the output of the second branch of the differentiator circuit.

When the second branch detects that the derivative of the input pulse is positive or zero, no signal is applied to the gate of the fourth transistor Q4, which is thus off. The gates of the second and third transistors Q2, Q3 are then connected to the input EI via the RC circuit, such that the second transistor Q2 is off whereas the third transistor Q3 is on. The mid-point between the second transistor Q2 and the third transistor Q3 is then connected to earth.

When the second branch detects that the derivative of the input pulse is negative, a signal is applied to the gate of the fourth transistor Q4 which is thus on. The gates of the second and third transistors Q2, Q3 are connected to earth, with an insulation ensured by the fourth resistor R4, such that the second transistor Q2 is on whereas the third transistor Q3 is off. The mid-point between the second transistor Q2 and the third transistor Q3 is then connected to the output of the RC circuit and then delivers a pulse corresponding to the discharge of the second capacitor C2.

The second branch for treating the input pulse includes in series between earth and the input EI of the system 1 a capacitor C3 and a parallel mounting of a sixth resistor R6 with a fifth resistor R5 in series with a diode D2 of which the cathode is directed to earth. The signal derived from the signal at the input EI of the system is again found at the terminals of the parallel mounting. The cathode of a diode D1 is connected to the mid-point between the diode D2 and the fifth resistor R5. The primary winding L3 of a transformer is connected to both the anode of the diode D1 and to earth through a seventh resistor. The secondary winding L4 of the transformer is connected to both earth through an eighth resistor R8 and to the gate of the fourth transistor Q4. This mounting ensures that the gate of the fourth transistor Q4 is supplied uniquely on detection of a negative part of the derivative of the signal at the input EI of the system, that is to say during a descending front of an input pulse Ve.

The control circuit moreover comprises a ferrite pulse transformer 5 arranged between the differentiator circuit 3 and the triggering circuit 4. The primary winding L2 of the transformer 5 is connected to the output of the differentiator circuit 3 (mid-point between the second transistor Q2 and the third transistor Q3) and the secondary winding L1 is connected to the first transistor Q1, for example to its gate electrode and to its cathode when the latter takes the form of a thyristor.

This solution consisting in using a ferrite core as pulse transformer to trigger a semiconductor switch may also be used for triggering the switch(es) of the generator 2, notably, when the generator includes several switches, to achieve a synchronised triggering of the switches on receiving, by the second input ED of the generator 2, the trigger signal Id of a discharge phase of the generator.

Figure 2:
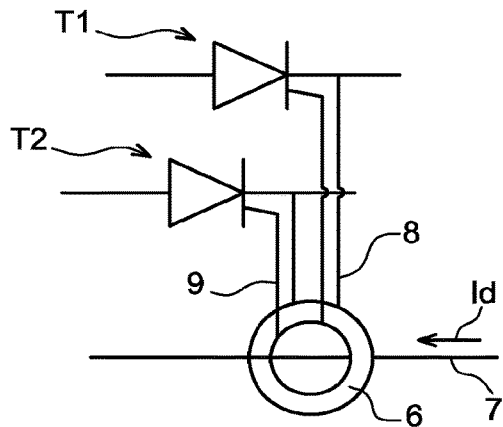
FIG. 2 illustrates a possible embodiment of a synchronised triggering of switches being able to be implemented in the invention.

With reference to FIG. 2 representing two thyristors T1, T2, a ferrite core 6 is used as pulse transformer. The primary winding consists of a single wire 7 on which transits the current pulse Id serving for the synchronous triggering of the thyristors. Two secondary windings 8, 9 are positioned on the core, each connected to the gate electrode and to the cathode of one of the thyristors T1, T2. In this configuration, the gate electrode currents all have the same shape and their amplitude is directly proportional to that of the triggering current pulse Id.

Figure 3A:
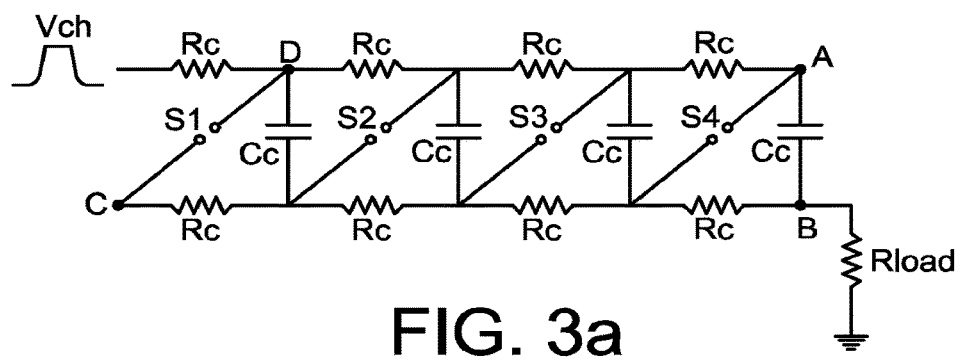
FIGS. 3a and 3b illustrate the operation in double polarity of a Marx generator that can be used in the invention.
Figure 3B:
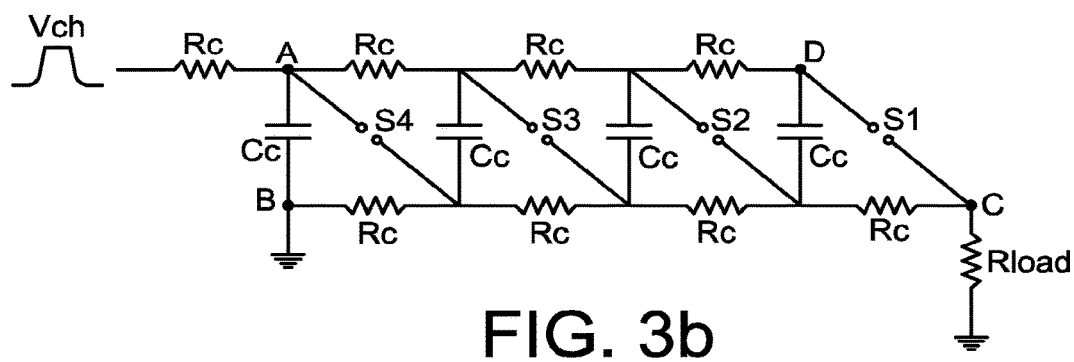

In a possible embodiment of the invention, and with reference to FIGS. 3*a* and 3*b*, the high voltage pulse generator is a Marx generator including a plurality of capacitors Cc connected together so as to be able to be charged in parallel, and to be discharged in series through switches S1-S4.

Such a generator has the advantage that a simple inversion thereof makes it possible to change the polarity of the high voltage output pulse without having to modify that of the input pulse. When the power supply Vch of a Marx generator is produced between the terminals C and D as represented in FIG. 3*a*, the output signal is negative. When the power supply Vch is produced between the points A and B as represented in FIG. 3*b*, the output signal is positive.

Figure 4A:
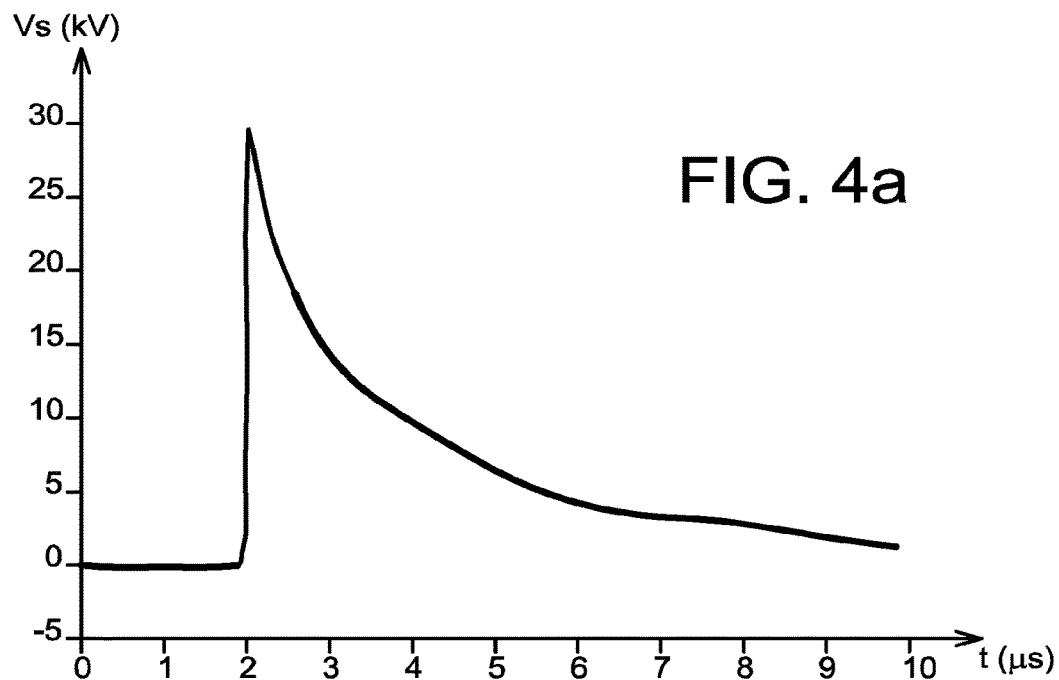
FIGS. 4a and 4b illustrate a high voltage pulse obtained by a generation system according to the invention, according to two different time scales.
Figure 4B:
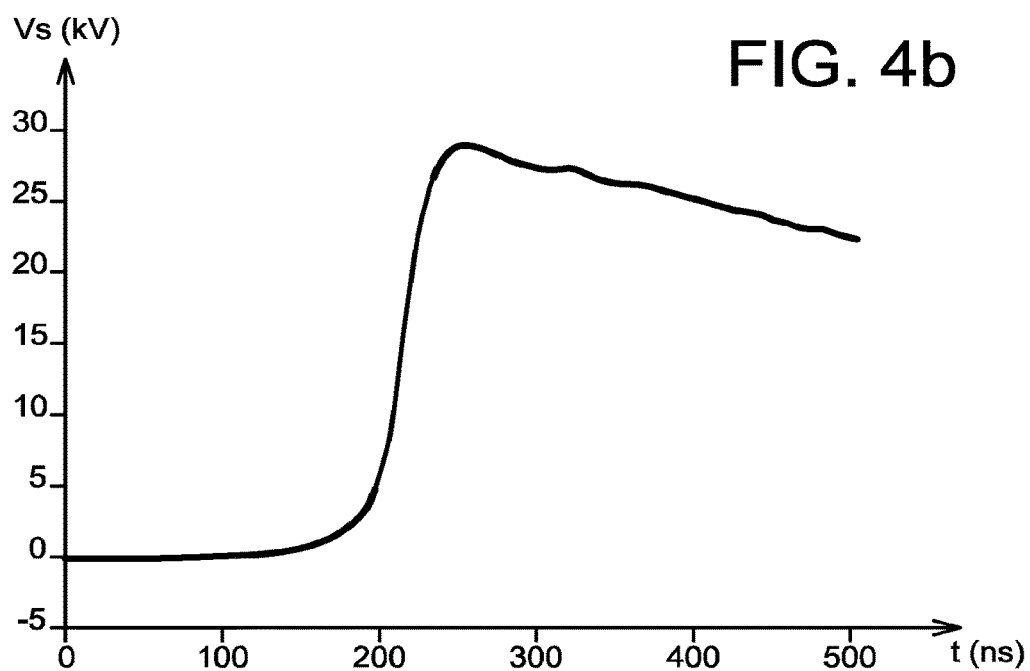

FIGS. 4*a* and 4*b* illustrate a high voltage pulse obtained by a system according to the invention, according to two different time scales. FIG. 4*a* thus illustrates an output pulse Vs of amplitude 30 kV on a resistive charge of 2 kΩ. FIG. 4*b* illustrates the rising front of the pulse of FIG. 4*a*: it is here 35 ns, with a triggering delay (also designated by the term "jitter") of the generator 1 below 5 ns.

The invention is not limited to the system as described previously but also extends to a method for generating high pulsed power by means of such a system, and notably to a method for generating high pulsed power by means of a high voltage pulse generator including a first input for receiving a signal from an input pulse in a charge phase of the generator and a second input for receiving a trigger signal of a discharge phase of the generator, characterised in that it comprises the steps consisting in detecting the end of the input pulse, and, following the detection of the end of the input pulse, generating and supplying to the second input of the generator a trigger signal of the discharge phase.

The invention offers the following advantages.

The system for generating pulsed power may be managed by a single and unique coaxial cable 50Ω. This leads to simplicity of implementation, not requiring bringing high voltage to the command-control bay, nor having to resort to an ancillary power supply or a connection to the 220V/50 Hz mains network.

The use of a stage generator, such as for example a Marx generator, makes it possible to limit the operating voltage of each stage to a level compatible with the use of low power, low cost components. Since the output voltage depends on the number of stages, it is in theory infinite.

The triggering of semiconductor switches by ferrite transformers ensures both a galvanic insulation of the control circuit and the power circuit (which results in robustness and simplicity of implementation at low cost) and the synchronised triggering of all the switches of the generator.

The output voltage is adjustable, for example from 20% to 100%.

The system uses neither radioactive source, nor pressurised gas, nor cooling system. It has no constraints in terms of EMC.

Its bulk is moreover reduced, for example two cards of 250*200*50 mm.

It is moreover self-sufficient, in that it does not require any LV or HV power supply, apart from the low voltage input signal.

The invention claimed is:

1. A system for generating pulsed power, comprising:
an input receiving an input pulse;
a pulse generator generating high voltage pulses, the pulse generator including a first input and a second input;
a voltage boosting circuit arranged between the input receiving the input pulse and the first input of the pulse generator; and
a control circuit connected to both the input for receiving the input pulse and to the second input of the pulse generator, the control circuit being configured to detect the end of the input pulse and to generate a trigger signal of a discharge phase of the pulse generator when the end of the input pulse is detected, the control circuit including a differentiator circuit configured to detect a positive or negative part of the derivative of the input pulse and a triggering circuit configured to supply the trigger signal to the second input of the pulse generator following the detection, by the differentiator circuit, of a positive or negative part of the derivative of the input pulse.

2. The system according to claim 1, wherein the triggering circuit includes a capacitor connected both to the first input of the pulse generator and to the second input of the pulse generator through a switch which is open in charge phase of the generator, closing of the switch being controlled following the detection, by the differentiator circuit, of a positive or negative part of the derivative of the input pulse.

3. The system according to claim 2, wherein the closing of the switch is achieved through a ferrite pulse transformer arranged between the differentiator circuit and the triggering circuit.

4. The system according to claim 1, wherein the voltage boosting circuit is configured to supply a continuous high voltage signal to the first input of the pulse generator.

5. The system according to claim 1, wherein the pulse generator includes at least one switch configured to be triggered on receiving, by the second input of the pulse generator, the trigger signal of a discharge phase of the generator.

6. The system according to claim 5, wherein the pulse generator includes a plurality of switches with synchronized triggering on receiving, by the second input of the pulse generator, the trigger signal of a discharge phase of the generator.

7. The system according to claim 6, wherein the pulse generator comprises a ferrite pulse transformer including a ferrite core crossed by a wire in which transits the trigger signal of a discharge phase of the pulse generator, a plurality of windings being positioned on the ferrite core, each of the windings being connected to one of the switches.

8. The system according to claim 1, wherein the pulse generator is a Marx generator including a plurality of capacitors connected together configured to be charged in parallel, and to be discharged in series through switches.

9. The system according to claim 1, further comprising a low voltage signal source, said low voltage signal source being connected to the input receiving the input pulse through a coaxial cable.

10. A method for generating high pulsed power by a system which comprises an input receiving an input pulse, a high voltage pulse generator including a first input and a second input, and a voltage boosting circuit arranged between the input receiving the input pulse and the first input of the high voltage pulse generator, the method comprising:
  detecting, by a differentiator circuit, a positive or negative part of the derivative of the input pulse; and
  following detection by the differentiator circuit of a positive or negative part of the derivative of the input pulse, generating and supplying, by a triggering circuit, to the second input of the high voltage pulse generator a trigger signal of a discharge phase of the high voltage pulse generator.

* * * * *